United States Patent
Bao (10) Patent No.: US 10,944,259 B2
(45) Date of Patent: Mar. 9, 2021

(54) SYSTEM AND METHOD FOR OVER VOLTAGE PROTECTION IN BOTH POSITIVE AND NEGATIVE POLARITIES

(71) Applicant: Cheng Bao, Waterloo (CA)

(72) Inventor: Cheng Bao, Waterloo (CA)

(73) Assignee: Cheng Bao, Waterloo (CA)

( * ) Notice: Subject to any disclaimer, the term of this patent is extended or adjusted under 35 U.S.C. 154(b) by 228 days.

(21) Appl. No.: 16/154,279

(22) Filed: Oct. 8, 2018

(65) Prior Publication Data
US 2020/0112169 A1 Apr. 9, 2020

(51) Int. Cl.
*G01R 27/02* (2006.01)
*H02H 11/00* (2006.01)
*H02H 9/04* (2006.01)
*H02H 1/00* (2006.01)

(52) U.S. Cl.
CPC .......... *H02H 11/006* (2013.01); *G01R 27/02* (2013.01); *H02H 1/0007* (2013.01); *H02H 9/045* (2013.01)

(58) Field of Classification Search
CPC .... H02H 11/006; H02H 1/0007; H02H 9/045; G01R 27/02
See application file for complete search history.

(56) References Cited

U.S. PATENT DOCUMENTS

| | | |
|---|---|---|
| 4,825,349 A | 4/1989 | Marcel |
| 4,870,341 A * | 9/1989 | Pihl ...................... A61N 1/3931 324/600 |
| 5,057,772 A * | 10/1991 | Bruno .................... G01R 31/50 324/754.03 |
| 5,684,382 A | 11/1997 | Fritz et al. |
| 5,872,443 A | 2/1999 | Williamson |
| 5,875,085 A | 2/1999 | Farley |
| 5,949,218 A | 9/1999 | Colles et al. |
| 6,288,881 B1 | 9/2001 | Melvin et al. |
| 6,331,763 B1 | 12/2001 | Thomas et al. |
| 6,426,606 B1 | 7/2002 | Purkey |
| 6,438,462 B1 | 8/2002 | Hanf et al. |
| 6,762,589 B2 | 7/2004 | Beerwerth et al. |
| 7,542,250 B2 | 6/2009 | Premerlani et al. |
| 8,058,845 B2 | 11/2011 | Tange et al. |
| 8,232,778 B1 | 7/2012 | Patel |
| 8,614,866 B2 | 12/2013 | Billingsley et al. |
| 9,059,584 B2 | 6/2015 | Spannhake et al. |

(Continued)

OTHER PUBLICATIONS

"1920: Precision LCR Meter User and Service Manual", IET Labs Inc., 2012.

(Continued)

*Primary Examiner* — Gary L Laxton (57) ABSTRACT

A system and method of protecting measurement circuits from a potentially energized device under test (DUT). In one embodiment, the DUT is a capacitor that has acquired a charge though some means prior to needing to test it. In this embodiment, a circuit is provided that protects the measurement circuit by both limiting the current to the measurement circuit while simultaneously dissipating the energy stored in the DUT. In a further embodiment, a detection circuit is provided to measure the voltage at the terminal of the DUT. Only when the magnitude of the voltage is lower than a specific threshold will the measurement circuit be switched to and connected with the DUT.

15 Claims, 7 Drawing Sheets

(56) References Cited

U.S. PATENT DOCUMENTS

| | | |
|---|---|---|
| 9,401,663 B2 | 7/2016 | Deboy |
| 9,601,943 B2 | 3/2017 | Partovi et al. |
| 2003/0193764 A1 | 10/2003 | Ziemer et al. |
| 2008/0062603 A1* | 3/2008 | Richter .................. H02H 3/025 361/93.1 |
| 2013/0027067 A1* | 1/2013 | Schwartz ........... G01R 31/2621 324/750.01 |
| 2017/0346140 A1 | 11/2017 | Koebler |

OTHER PUBLICATIONS

"LCR Measurement Primer", IET Labs Inc., Apr. 2012.
"Application Note: Charged Capacitor Protection Circuit for the IET LCR Meters", IET Labs Inc., Oct. 2012.
"LCR Meassurement Priimer", Quadtech, Aug. 2002.
"Application Note: Charged Capacitor Protection Circuit for the GenRad Digibridges", IET Labs Inc., Feb. 2002.

* cited by examiner

SYSTEM AND METHOD FOR OVER VOLTAGE PROTECTION IN BOTH POSITIVE AND NEGATIVE POLARITIES

BACKGROUND

Field of the Invention

The present invention relates to providing a protection circuit for sensitive measurement circuits.

Description of the Related Art

In the electronics industry, measurement of the electrical impedance of devices is an important function. Many activities require the accurate and precise measurement of electronic components, circuits or networks. One particular example of a common measurement device is the LCR (Inductance, Capacitance, Resistance) measurement device for measuring the impedance of a two terminal component or network, known as a DUT or Device Under Test. The DUT can be either a simple electronic device such as a resistor or capacitor, or it can be any two terminals in a network of components for which knowledge of the impedance between those terminals is required. DUT measurement devices can be used to verify or diagnose complex electrical or electronic circuits either in isolation or in circuit in the field.

In many cases, the measurement device is required to have great sensitivity and accuracy to adequately characterize the component or network. In many cases as well, the DUT can have stored energy, for example in the case of a capacitor or a battery. The energy in the DUT has been known to cause damage to the measurement circuit, thus requiring expensive and time-consuming repairs. The described protection circuits are also effective at protecting the measurement circuit from damage in situations where the stored energy is present from another part of the electrical or electronic circuit, or is supplied by active means such as a battery, or power supply.

What is needed is a method of automatically protecting the input circuit of an impedance measuring device from energized DUTs.

SUMMARY

The system is disclosed that provides a method of protecting measurement circuits from a potentially energized DUT. In one embodiment, the DUT is a capacitor that may have acquired a charge though some means prior to needing to test it. In this embodiment, a circuit is provided that protects the measurement circuit by both limiting the current to the measurement circuit while simultaneously dissipating the energy stored in the DUT.

In a different embodiment, a detection circuit is provided to measure the voltage at the terminal of the DUT. Only when the magnitude of the voltage is lower than a specific threshold, will the measurement circuit be switched to and connected with the DUT.

BRIEF DESCRIPTION OF THE DRAWINGS

In order that the subject matter may be readily understood, embodiments are illustrated by way of examples in the accompanying drawings, in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Figure 1:
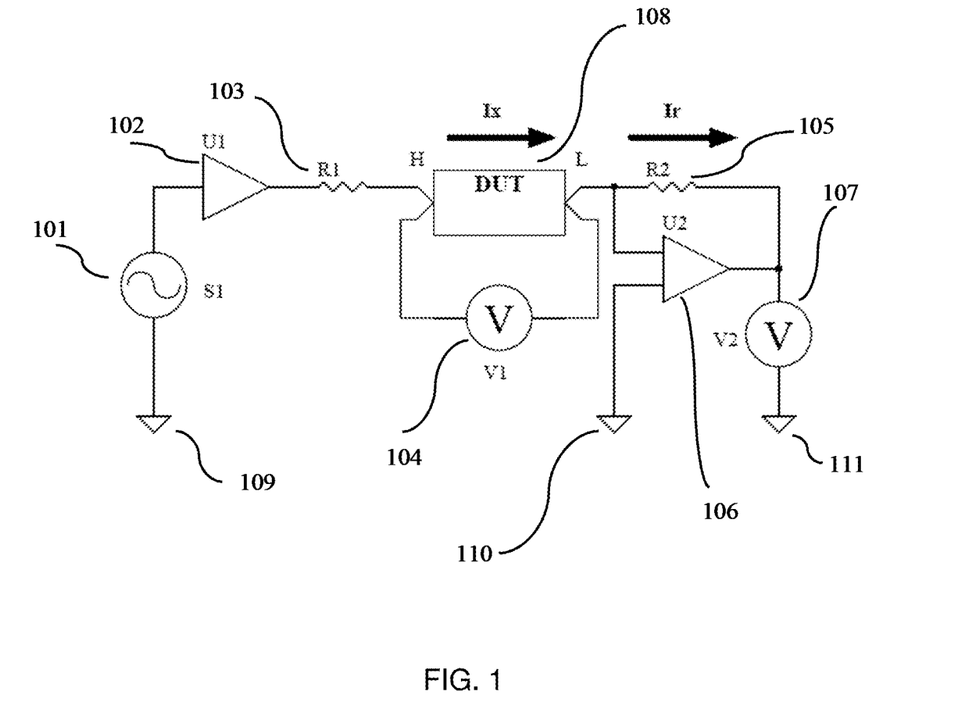
FIG. 1 shows a diagram of a typical circuit for measuring the impedance of an electronic device.

FIG. 1 shows a typical circuit for measuring the impedance of a DUT 108. To accurately measure the complex impedance of the DUT 108, a test signal 101 is generated by a signal generator. This signal generator can be of several different well-known forms, such as a microprocessor-controlled waveform generator, an oscillator, or similar circuit. Generally, the signal generator creates a sinusoidal voltage waveform referenced to ground 109, but may also be a more complex signal including direct current and/or alternating current components. The signal frequency can also generally be varied to provide better accuracy readings for different measurement ranges.

The output of the signal generator is connected to an amplifier 102 where the signal is amplified and transformed to a low impedance signal. The output of the amplifier is connected to fixed resistor 103 to create a known resistive impedance to connect to the DUT 108. The DUT is connected to resistor 103 by means of a wire. The connection to the DUT is by means of a Kelvin connection, or 4 wire measurement to minimize any measurement distortion.

A voltage measurement circuit 104 is connected by Kelvin connection directly to terminals H and L of the DUT 108. The L side of the DUT 108 is connected to resistor 105. Resistor 105 and operational amplifier 106 are connected in a transresistance configuration, such that the current through resistor 105 (Ir) is transformed to a voltage at the output of the operational amplifier 106. The voltage at the output of operational amplifier 106 is connected to a voltage measuring circuit 107. The voltage measuring circuit is connected to and referenced to ground, 111. Similarly, the operational amplifier 106 has its reference connected to ground, 110.

The impedance of the DUT 108 is determined by creating a generating signal 101, and then noting the voltage across the voltage measurement circuit 104. Since the L side connection of the DUT 108 is a 'virtual ground', due to the connection to the negative feedback terminal of the operational amplifier, the measurement circuit, 104 will be the voltage imposed by the test signal across the terminals of the DUT 108. The impedance of the DUT is calculated where the magnitude of the impedance is the ratio between the measured voltage across the DUT and the current through resistor 105 (Ir), and the phase angle of the DUT impedance can be calculated by comparing the phase angle of the voltage across the DUT to the phase angle of the current through the DUT.

Figure 2:
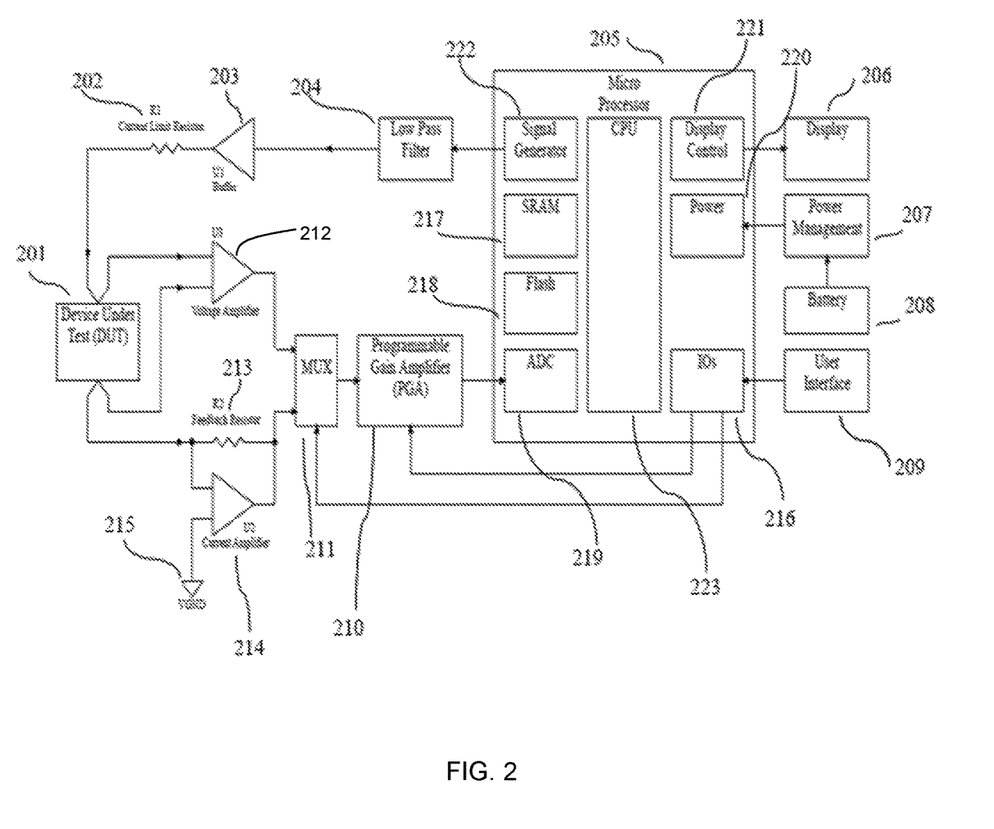
FIG. 2 illustrates a typical circuit for measuring the impedance of a DUT with additional details about the measurement device.

FIG. 2 illustrates a typical circuit for measuring the impedance of a DUT with additional details. The DUT 201 is connected via resistor 202 to an operational amplifier circuit 203. The input of the operational amplifier 203 is connected to the output of a Low Pass Filter 204 that removes unwanted higher frequency components of the signal. The input of the Low Pass Filter 204 is connected to the Microprocessor 205, and specifically to the Signal Generator module 222 within the microprocessor. The Signal Generator Module can be implemented as an analog oscillator, or commonly is implemented as a Digital to Analog converter that can be controlled from the CPU 223 of the microprocessor.

The CPU 223 executes a control program that sequences the individual circuit controls and measurements required to complete and compute the measuring of the impedance of the DUT 201. Also within the control module are additional components common to the design and construction of microprocessor controlled measurement devices: The Flash Memory 218 contains storage for the program that is sequence of operations that the CPU must execute to complete the DUT impedance measurement function. Flash memory is typically non-volatile memory. Flash memory also has the ability to be reprogrammed with different instructions, as may be required from time to time. The SRAM 217 is temporary, volatile memory that is used to store values for intermediate calculations, and operating parameters such as measurement preferences.

The Microprocessor 205 also contains a Display Control 221 that interfaces with a human readable display 206 to display the results of measurements, and to indicate configuration parameters. The control module also requires a Power Supply and Distribution circuit 220 to supply and sequence power to the circuitry within the control module. The input to the power supply and distribution circuit is connected to the output of the Power Management module 207. The Power Management module is connected to one or more power sources such as a Battery, 208, and/or other power supply such as an AC adapter (not shown). In some cases, the Power Management module will also perform battery management functions, such as charging a battery.

The User Interface 209 connects to the input output module inside the Microprocessor 205. The Input Output Module 216 is comprised of a number of signal lines that are designed to accept the output of user operable controls such as selector buttons, dials, touch screens, and other user interface elements. The Input Output Module 216 relays the status of these user operable controls to control and guide the execution of the CPU through the steps required to operate the measurement routines. A second function of the Input Output Module 216 is to provide signals required for additional circuitry.

One of the output signals from the Input Output module 216 is connected to a selector input of the multiplexer module MUX 211. This control signal selects which of the two input channels on the MUX will be connected to the output of the MUX, and would normally be a single binary logic signal. The input channels can thus be selected from voltage amplifier 212 or from current amplifier 214. The multiplexer output is connected to the input of the programmable gain amplifier (PGA) 210. The PGA is an amplifier module that can amplify the input signal with a number of different gains. The control signal to the PGA 210 from the Input Output module 216 can take a number of forms such as one or more binary control signals, an analog control signal, or a digital control bus signal such as I$^2$C. The output of the PGA 210 is connected to the Analog to Digital Converter (ADC) 219.

Returning to the two inputs to the MUX 211 one selectable input is from the output of voltage amplifier 212. This voltage amplifier is connected across the DUT 201, and amplifies the voltage across the DUT terminals. This voltage is used in the calculation of the impedance measurement. The other selectable input is from the output of current amplifier 214. The current amplifier 214 along with resistor 213 are connected in a transresistance configuration that creates a voltage at the output of the current amplifier 214 that is proportional to the current through the DUT 201. Since the positive, or reference terminal of current amplifier 214 is connected to VGND 215, the negative or feedback terminal will also be at VGND while current amplifier 214 is in linear or operational amplifying mode.

Figure 3:
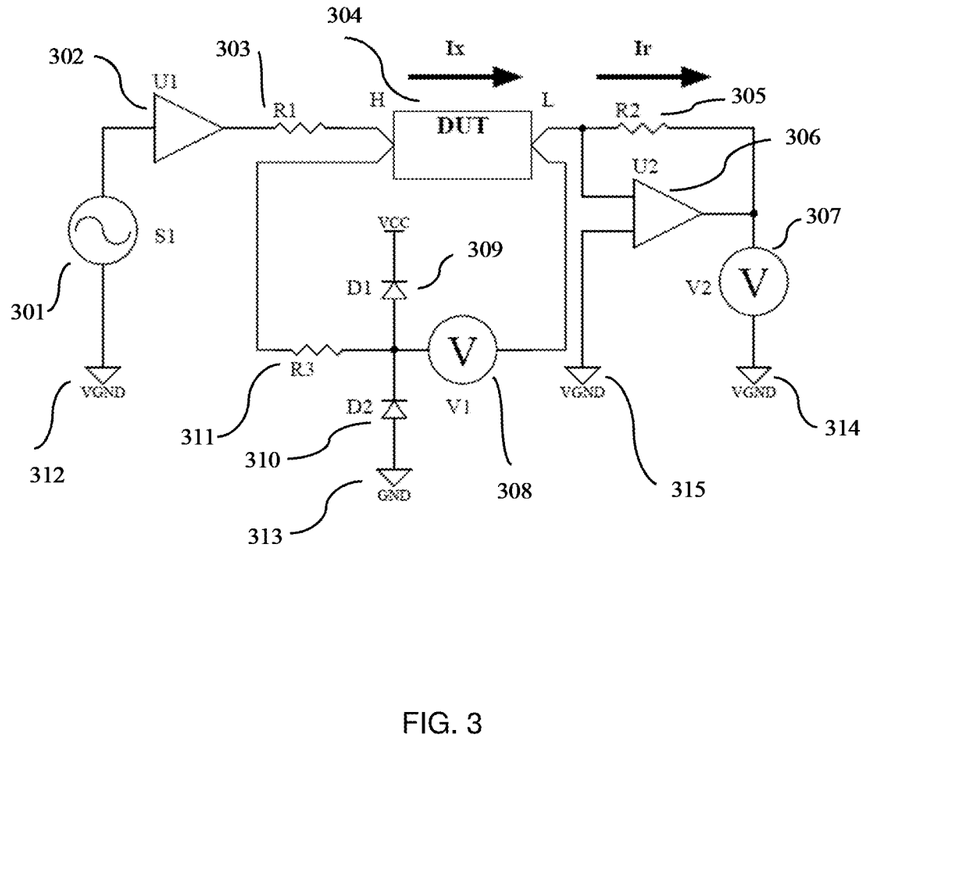
FIG. 3 shows an embodiment of one of the methods of protecting an impedance measuring circuit

FIG. 3 shows an embodiment of one of the methods of protecting an impedance measuring circuit. Signal generator 301, is connected to the input of amplifier 302. The amplifier reproduces the input signal at the output of amplifier 302. The output of amplifier 302 is low impedance. A low impedance signal source is important for the accurate measurement of the DUT 304, as the test signal won't get distorted when measuring different DUTs with different impedances. The output of the amplifier 302 is connected to a low value fixed resistor 303 which limits the max current supplies to the DUT.

Resistor 303 also has an important function in the protection of the measurement circuit from a DUT with stored energy. Since the L side of the DUT 304 is a virtual ground, any voltage that is present across the terminals of the DUT as a result of the stored energy in the DUT will appear on the H side of the DUT. In many cases, such as for large capacitors, the stored energy can be significant and have a very low impedance. Since the output of the amplifier 302 is also low impedance, there would be a potential for a rapid discharge of the energy in the DUT 304 that could potentially damage the components of the circuit, in many cases damaging the output stages of amplifier 302.

Resistor 303 is an energy dissipation element that helps to limit the energy from the DUT that would be transferred to the rest of the measurement circuit. Resistor 303 should be as small an ohmic value as practical to both protect the circuit and to provide good sensitivity for measurement. The DUT 304 H side, is also connected by a 4 wire interface to resistor 311. Resistor 311 is also connected to a node that connects to the anode of diode 309, and the cathode of diode 310. The cathode of diode 309 connects to the positive voltage supply VCC, and the anode of diode 310 connects to ground, 313.

If the voltage on the H terminal of the DUT 304, is above VCC, diode 309 will forward conduct current into VCC, and resistor 311 will limit the current that is conducted. For practical diodes, there will also be a forward voltage drop across diode 309 of a few tenths of a volt depending on the technology used in the fabrication of the diode. This protection circuit advantageously keeps the voltage input to the voltmeter 308 to within a few tenths of a volt of VCC, thus avoiding input circuit damage. Similarly, if the voltage on terminal H of the DUT 304 is negative, diode 310 will forward conduct current from GND 313 and resistor 311 will limit the current that is conducted. In the case where the H terminal of the DUT 304 is a negative voltage, the voltage presented to the voltmeter 308 is limited to a few tenths of a volt below ground, avoiding damage to the voltmeter 308.

The L side of the DUT 304 is connected to a side of the voltmeter 308. Thus, voltmeter 308 measures the voltage across the DUT plus any voltage drop across resistor 311. Under normal measurement conditions that are not discharging energy from the DUT 304, the current through resistor 311, and hence the voltage drop across resistor 311 is minimal, as neither diode 309 or diode 310 are in a forward conduction state. Note as well that input impedance of the voltmeter 308 is high impedance. Thus, the voltage measured at the voltmeter 308 is accurately close to the voltage across the DUT. The L side of the DUT 304 is also connected to a node that connects to both the negative terminal of amplifier 306 and to resistor 305.

The output of amplifier 306 is connected to resistor 305 to complete the transresistance configuration that transforms the current through the DUT 304 into a voltage at the output of amplifier 306. This voltage is measured by voltmeter 307 and compared to VGND 314. The positive reference terminal of the amplifier 306 is also connected to VGND 315.

The circuit in FIG. 3 includes a frequency and amplitude controllable signal generator 301 and a method of detecting the resultant voltage and current. This measurement system can be used to not only measure impedance, but by varying the frequency of the stimulus, produce a more detailed frequency and amplitude map of the DUT or connected system, similar to a frequency domain or spectrum analyzer. Similarly, other measurement can be performed by varying amplitude of the response to characterize such parameters as DUT circuit nonlinearities and distortions.

Figure 4:
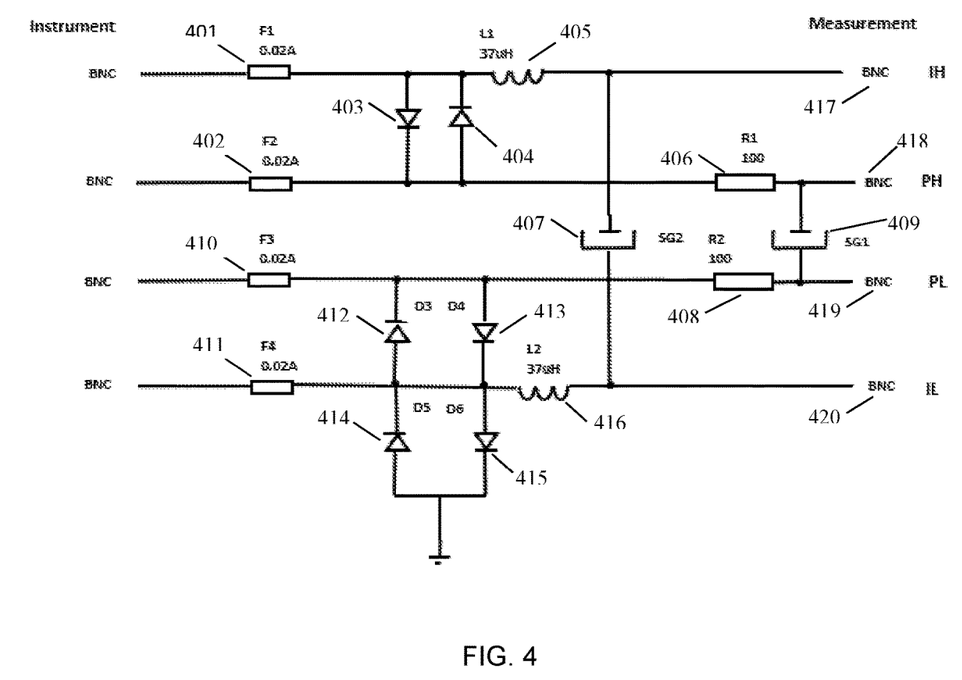
FIG. 4 shows a protection circuit that is published by a manufacturer of LCR meters.

FIG. 4 shows a protection circuit that is published by a manufacturer of LCR meters. In this circuit, the manufacturer uses a combination of resistive elements, spark gap elements, diodes and fuses to protect the input circuits of the measurement device. The signals IH 417, PH 418, PL 419, and IL 420 are the four wire circuit connections to the DUT (not shown). IH 417 and PH 418 are connected to one side of the DUT. Similarly, PL 419 and IL 420 are connected to the other side of the DUT. Voltage across the DUT will be also presented across spark gap 407 and 409.

The voltage measurement circuit originating at PH 418 and PL 419 are passed through two resistive elements 406 and 408 as well as two fuse components 402, and 410. The current measurement circuit originating at IH 417 and IL 420 are passed through two fuse components 401, and 411 and inductors 405 and 416 that provide additional reactance and provide a blocking function to incoming signals with fast transients, such as during the connection of an energized DUT. Additionally, Diodes 403, 404, 412, 413, 414, 415 keep the voltages between the pairs of signals going to the Instrument within a diode drop or a few tenths of a volt. While effective at preventing damage from some energized DUT's, this circuit is complex, may need frequent fuse replacement, and requires that the component values be tuned for various protection scenarios.

Figure 5:
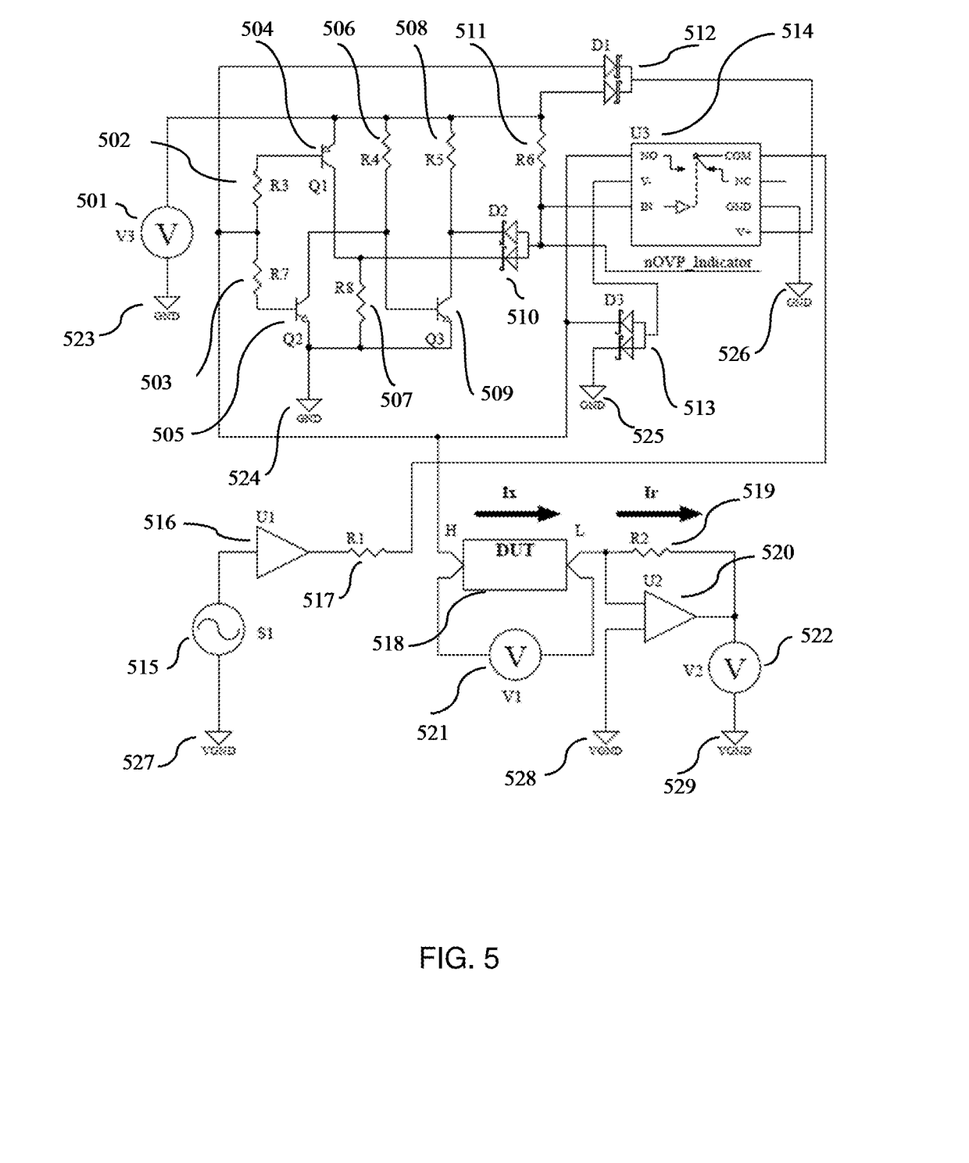
FIG. 5 shows one of the preferred embodiments of a protection circuit to protect a measurement circuit from an energized electronic device.

FIG. 5 shows one of the preferred embodiments of a protection circuit to protect a measurement circuit from an energized DUT 518. Voltage source 501 is a set voltage power supply that provides power to portions of the circuit. The negative or reference end of 501 is ground GND 523. A wide range of voltages for voltage source 501 are possible for correct operation of this circuit. In a specific preferred embodiment, the voltage source 501 can be set at the common power rail voltage.

The voltage output of voltage source 501 is connected to the emitter of transistor 504, resistor 506, resistor 508 and resistor 511. The other side of resistor 511 is connected to the IN signal of analog switch 514. Switch 514 is preferably an analog switch component, such as the DG449 manufactured by Vishay Corporation, although a number of suitable alternatives are available. If the IN terminal of switch 514 is in a logic high state, the analog switch function is turned 'on' and the COM pin is connected to the NO, or Normally Open pin. If there is negligible current flowing through either half of diode 510 then the IN terminal of 514 will be held at logic high, close to the voltage source 501.

The signal at the IN terminal of 514 may also be routed as an indicator to other parts of the measurement circuit, indicating whether or not the circuit is in 'protection mode' due to a detected energy in or voltage on the DUT 518. In order to detect whether there is energy in the DUT, thus requiring protection for the circuit, a sensing signal is connected from the H side of the DUT 518 to resistors 502 and 503. The other side of resistor 502 is connected to the base of transistor 504. The other side of resistor 503 is connected to the base of transistor 505. The emitter of transistor 505 is connected to GND 524. In normal operation (no significant energy detected in the DUT 518), the test signal on DUT H side (NO output of analog switch, 514) is around 1V higher than GND and around 1V lower than V3. Therefore, transistor 504 and 505 are on and transistor 509 is off. In the condition where there is a positive voltage on the DUT, transistor 504 will switch off, causing resistor 507 to draw current through diode 510 and bringing the logic level of the IN terminal of switch 514 low.

Similarly, in the condition where there is a negative voltage on the DUT, transistor 505 will switch off, transistor 509 will switch on, and current will be drawn through diode 510 thus bringing the logic level of the IN terminal of switch 514 low. Dual diode 513 is preferably a Shottky diode that has a low forward voltage drop. Diode array 513 is used to clamp the voltage level on switch 514 V− pin to negative power rail (GND 525 for single supply buffer) or the external voltage level (voltage on the H side of the DUT 518) whichever is lower. Similarly, Diode array 512, is used to clamp the voltage level on switch 514 V+ pin to positive power rail of voltage source 501 or the voltage level on the H side of the DUT 518 whichever is higher.

Signal generator 515 is connected to the input of amplifier 516 and referenced to VGND 527. The amplifier 516 converts the high impedance signal to a low impedance signal at the output of 516. The output of amplifier 516 is connected to resistor 517. Resistor 517 provides a fixed low value resistor to help dissipate any energy that may be instantaneously present from the connection of an energized DUT 518 before the protection circuitry can be activated. Resistor 517 is connected to the COM terminal of switch 514. The COM terminal is one side of the analog switch in switch 514. Voltmeter 521 is connected across the two terminals of the DUT 518 via a 4 wire Kelvin connection.

The L side of the DUT 518 is also connected to a node that connects to both the negative terminal of amplifier 520 and to resistor 519. The output of amplifier 520 is connected to resistor 519 to complete the transresistance configuration that transforms the current through the DUT 518 into a voltage at the output of amplifier 520. This voltage is measured by voltmeter 522 and compared to VGND 529. The positive reference terminal of the amplifier 520 is also connected to VGND 528. The system thus described has the advantage of nearly instantaneous detection and isolation of an energized DUT, plus providing an indication to the test system that the measurement is not currently possible.

Figure 6:
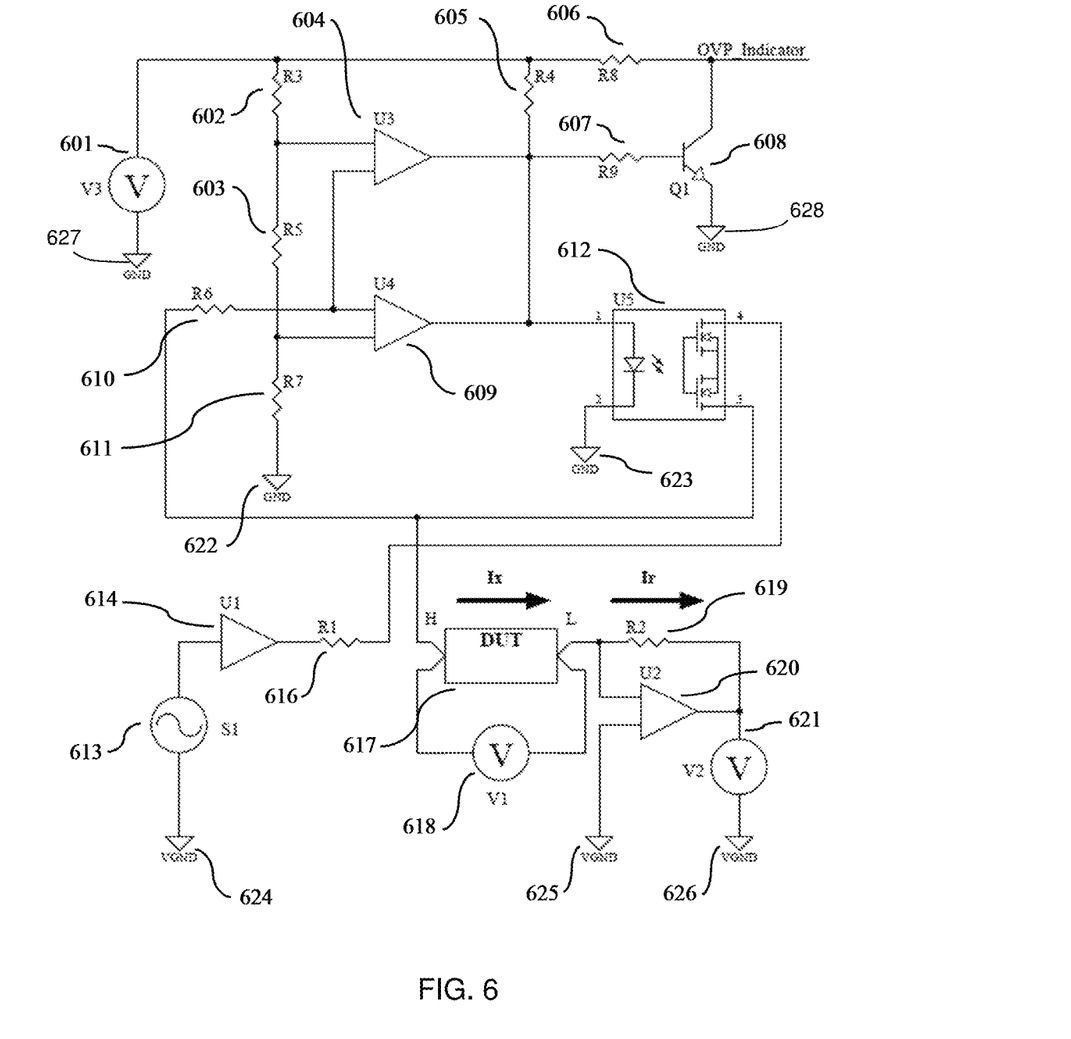
FIG. 6 shows a second preferred embodiment for providing automatic protection circuitry for a measurement system.

FIG. 6 shows a second preferred embodiment for providing automatic protection circuitry for a measurement system. Voltage source 601 provides a DC voltage referenced to GND 627. The output of voltage source 601 is connected to a resistor ladder comprised of resistor 602, resistor 603, and resistor 611. The end of the resistor ladder is connected to GND 622. The resistor ladder generates two intermediate voltages, one of which is connected to the reference terminal of comparator 604, and the other of which is connected to the reference terminal of comparator 609. The output of the comparators 604 and 609 are wired together. Preferably, these comparators have open drain outputs or similar that provide for ease of use in a wired- or configuration. Resistor 605 provides a passive high pull up to the output of the comparator circuit comprised of comparator 604 and 609. This configuration provides a window comparator function that measures the voltage on the H side of the DUT 617. i.e. determines if this voltage is greater than a specific value or less than another specific value. The value of resistor 602, resistor 603, and resistor 611 can be selected to make the window comparator output go high when the voltage on DUT H-side is normal and go low when the voltage on DUT 617 H-side is out of range (either too high or too low). The DUT 617 H side is connected to the input of the comparator circuit through resistor 610.

Resistor 607 is also connected to the output of comparators 604 and 609. Resistor 607 in combination with transistor 608 and resistor 606 are configured as a logical inverter. When the comparators 604 and 609 are not sinking current, transistor 608 will be conducting current since base current will flow through resistor 605 and 607 into the base of transistor 608, thus causing the collector of transistor 608 to be at a logic level low. When either comparator 604 or 609 are sinking current (output low), the base of transistor 608 will be low, and the OVP indicator connected to the collector of transistor 608 will be at a high logic level. The value of resistor 607 should be chosen to be a low enough value to turn on transistor 608 and a high enough value to permit proper operation of the optically controlled transistor 612. Further, end of transistor 608 is connected to GND 628.

The opto-diode (optically emitting diode) portion of the optically controlled transistor 612 is connected to the output of the comparators 604 and 609. When in normal operation, the voltage on the DUT 617 H side is in the range that is programmed by the value of resistor 602, resistor 603, and resistor 611, the outputs of comparators 604 and 609 go high and are not sinking current. Current will flow through resistor 605 through the opto-diode to GND 623, turning the opto-diode on, and thus turning on the signal path through the optically controlled Field Effect Transistors in transistor 612. When an energized DUT 617 is inserted into the measurement circuit, the voltage on the DUT 617 H side is out of the range that is programmed by the value of resistor 602, resistor 603, and resistor 611. The either of the outputs of comparators 604 and 609 go low and are sinking current, the voltage at pin 1 of transistor 612 will be low, turning the opto-diode off, and thus turning off the signal path through the optically controlled Field Effect Transistors in transistor 612. To accurately measure the complex impedance of the DUT 617, a test signal is generated by a signal generator 613. This signal generator can be of several different well-known forms, such as a microprocessor-controlled waveform generator, an oscillator, or similar circuit. Generally, the signal generator creates a sinusoidal voltage waveform referenced to ground, 624, but may also be a more complex signal including direct current and/or alternating current components. In this embodiment, a preferred signal would be an AC sinusoidal signal superimposed on a DC offset such that the resulting signal would stay within range of the window comparison circuit.

The signal frequency can also generally be varied to provide better accuracy readings for different measurement ranges. The output of the signal generator is connected to an amplifier 614 where the signal is amplified and transformed to a low impedance signal. The output of the amplifier is connected to fixed resistor 616 to create a known resistive impedance to connect to the DUT 617 through the optically controlled Field Effect Transistors in transistor 612. Voltmeter 618 is connected across the two terminals of the DUT 617 via a 4 wire Kelvin connection. The L side of the DUT 617 is also connected to a node that connects to both the negative terminal of amplifier 620 and to resistor 619. The output of amplifier 620 is connected to resistor 619 to complete the transresistance configuration that transforms the current through the DUT, 617 into a voltage at the output of amplifier 620. This voltage is measured by voltmeter 621 and compared to VGND 626. The positive reference terminal of the amplifier 620 is also connected to VGND 625.

Figure 7:
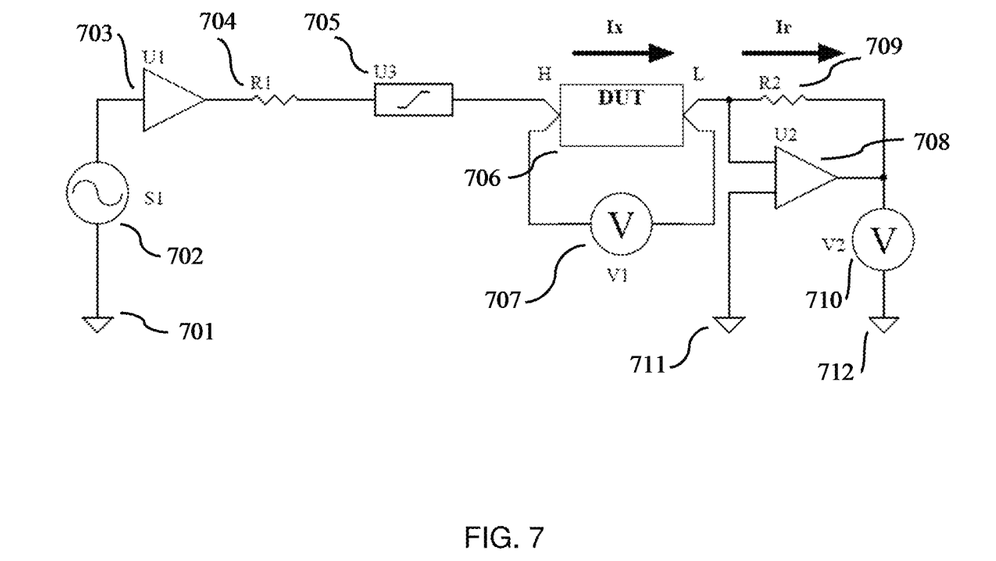
FIG. 7 shows an alternative method of protecting the input of a measurement circuit using an inline transient suppressor.

FIG. 7 shows an alternative method of protecting the input of a measurement circuit using an inline transient suppressor. Transient suppressors have a unique VI curve that suitably protects measurement circuits from energized DUTs. Signal generator 702, referenced to GND 701 is connected to the input of amplifier 703. The amplifier reproduces the input signal at the output of amplifier 703. The output of the amplifier 703 is low impedance. A low impedance signal source is important for the accurate measurement of the DUT 706, as the test signal will not get distorted when measuring different DUTs with different impedances.

The output of the amplifier 703 is connected to a low value fixed resistor 704 which limits the max current supplies to the DUT. Resistor 704 also has an important function in the protection of the measurement circuit from a DUT with stored energy. Since the L side of the DUT 706 is a virtual ground, any voltage that is present across the terminals of the DUT as a result of the stored energy in the DUT will appear on the H side of the DUT 706. In many cases, such as for large capacitors, the stored energy can be significant and have a very low impedance. Since the output of the amplifier 703 is also low impedance, there would be a potential for a rapid discharge of the energy in the DUT 706 that could potentially damage the components of the circuit, in many cases damaging the output stages of amplifier 703. Resistor 704 is an energy dissipation element that helps to limit the energy from the DUT that would be transferred to the rest of the measurement circuit. Resistor 704 should be as small an ohmic value as practical to both protect the circuit and to provide good sensitivity for measurement.

In this circuit, in addition to resistor 704 being in series between the amplifier 703 and the DUT 706 an additional element 705 is placed in series. In the preferred embodiment, this element is a transient suppression device such as the Bourns® TCS™ DL Series High-Speed Protector, although any component or combination of components that provide a high impedance path to rapidly increasing voltages could be substituted. This element conducts the measurement signal during normal operation, but will transition to a high impedance mode rapidly in the case where an energized DUT 706 is inserted into the measurement circuit.

One of the advantages of such a device is that the protection is bi-directional, thus protecting from both positive and negative transient voltages from the DUT. Voltmeter 707 is connected across the two terminals of the DUT 706 via a 4 wire Kelvin connection. The L side of the DUT 706 is also connected to a node that connects to both the negative terminal of amplifier 708 and to resistor 709. The output of amplifier 708 is connected to resistor 709 to complete the transresistance configuration that transforms the current through the DUT 706 into a voltage at the output of amplifier 708. This voltage is measured by voltmeter 710 and compared to GND 712. The positive reference terminal of the amplifier 708 is also connected to GND 711.

While the present disclosure describes various embodiments for illustrative purposes, such description is not intended to be limited to such embodiments. On the contrary, the applicant's teachings described and illustrated herein encompass various alternatives, modifications, and equivalents, without departing from the embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become obvious to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims. Moreover, no requirement exists for a system or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, as may be apparent to those of ordinary skill in the art, are also encompassed by the present disclosure.

INDUSTRIAL APPLICABILITY

The subject matter of the present disclosure industrially applies to electrical circuits. More particularly, subject matter of the present disclosure industrially applies to the field of protection circuit for sensitive measurement circuits.

I claim:

1. A protection circuit that provides protection for a measurement circuit that is used to measure parameters of a Device Under Test (DUT) whereby the DUT is provided with at least two terminals, the circuit comprising:
    a connection mechanism for electrically connecting the DUT to the measurement circuit;
    an energy dissipation circuit that limits electrical energy that can be transferred from the DUT to at least a portion of the measurement circuit upon connection; and
    a voltage limiting circuit to limit applied voltage from the DUT to at least a portion of the measurement circuit;
    wherein measurement is done across two terminals of the DUT.

2. The protection circuit according to claim 1, wherein the energy dissipation circuit is a resistor.

3. The protection circuit according to claim 1, wherein the energy dissipation circuit is a transient absorber.

4. The protection circuit according to claim 1, wherein the voltage limiting circuit is a voltage clamping circuit at least in part consisting of diodes.

5. A protection circuit that provides protection for a measurement circuit that is used to measure parameters of a Device Under Test (DUT) whereby the DUT is provided with at least two terminals, the circuit comprising:
    a voltage detection circuit that detects voltage at the terminals of a DUT;
    an isolation means that protects the measurement circuit from energy stored in the DUT; and
    a switch that disengages the isolation means and connects the DUT to the measurement circuit only when a voltage of a sufficiently low magnitude is detected at the terminals of the DUT;
    wherein the isolation means does not engage an alternate current path for power supplied to the DUT.

6. The protection circuit according to claim 5, whereby the detection circuit detects terminal voltages between at least two of the terminals of the DUT in either polarity.

7. The protection circuit according to claim 5, whereby the protection circuit provides a notification that an energized DUT has been connected to a measurement device.

8. The protection circuit according to claim 7, wherein the notification is made by means of a signal that is announced to an operator.

9. The protection circuit according to claim 7, wherein the notification is made to a logic circuit or microprocessor for further action on the energized DUT condition.

10. The protection circuit according to claim 5, whereby the protection circuit is designed to safely dissipate the energy in the DUT before continuing the measurement.

11. A method of protecting a measurement device, the method comprising:
    detecting a voltage between two terminals of a Device Under Test (DUT);
    determining if the DUT has stored or supplied energy by comparing greater than a specific value or less than another specific value of the voltage at the terminals of the DUT to a predetermined value;
    engaging a switch to connect the DUT to a measurement circuit when the magnitude of the measured voltage at the terminals of the DUT is less than the predetermined value; and
    performing the measurement of an electrical parameter of the DUT;
    wherein the detection of the voltage at the terminals of a DUT occurs before the engaging of a switch to connect the DUT to a measurement circuit.

12. The method according to claim 11 where the measurement device is an impedance measurement device.

13. The method according to claim 11 where the measurement device measures the complex impedance of the DUT.

14. The method according to claim 11 where the measurement device characterizes a frequency and amplitude map of the DUT.

15. The method according to claim 11 where the measurement device characterizes or distortion characteristics of the DUT.

\* \* \* \* \*